US010211108B2

(12) United States Patent
Han et al.

(10) Patent No.: US 10,211,108 B2
(45) Date of Patent: Feb. 19, 2019

(54) GATE STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Qiu Hua Han, Shanghai (CN); Shi Liang Ji, Shanghai (CN); Yan Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/673,547

(22) Filed: Aug. 10, 2017

(65) Prior Publication Data

US 2018/0047638 A1    Feb. 15, 2018

(30) Foreign Application Priority Data

Aug. 12, 2016 (CN) .......................... 2016 1 0662540

(51) Int. Cl.
*H01L 21/8234* (2006.01)
*H01L 29/423* (2006.01)
(Continued)

(52) U.S. Cl.
CPC ............. *H01L 21/823842* (2013.01); *H01L 21/28088* (2013.01); *H01L 21/28114* (2013.01);
(Continued)

(58) Field of Classification Search
CPC ....... H01L 21/28114; H01L 21/823437; H01L 21/82345; H01L 21/823456;
(Continued)

(56) References Cited

U.S. PATENT DOCUMENTS

| 5,413,670 A | 5/1995 | Langan et al. |
| 6,376,888 B1 * | 4/2002 | Tsunashima ...... H01L 21/28088 |
| | | 257/407 |

(Continued)

OTHER PUBLICATIONS

The European Patent Office (EPO) The Extended European Search Report for 17185481.3 dated Nov. 21, 2017 8 Pages.

*Primary Examiner* — Stephen W Smoot
(74) *Attorney, Agent, or Firm* — Anova Law Group, PLLC

(57) ABSTRACT

A method for fabricating a semiconductor structure includes forming a plurality of dummy gate structures on a substrate. Each dummy gate structure includes a gate dielectric layer, a dummy gate electrode, and two sidewall spacers. The method also includes forming a dielectric layer on the substrate between neighboring dummy gate structures and removing a portion of each dummy gate electrode to form a first opening. The first opening is surrounded by a remaining portion of the dummy gate electrode and the two sidewall spacers. The method further includes removing a portion of each sidewall spacer along a direction perpendicular to the sidewall of the first opening to form a second opening, removing the remaining portion of the gate electrode on the bottom of each second opening to form a third opening, and then filling each third opening with a gate electrode material to form a gate electrode.

20 Claims, 6 Drawing Sheets

(51) Int. Cl.
  *H01L 21/8238* (2006.01)
  *H01L 21/28* (2006.01)
  *H01L 27/092* (2006.01)
  *H01L 29/49* (2006.01)
  *H01L 29/51* (2006.01)
  *H01L 29/66* (2006.01)

(52) U.S. Cl.
  CPC .. *H01L 21/82345* (2013.01); *H01L 21/82385* (2013.01); *H01L 21/823456* (2013.01); *H01L 27/092* (2013.01); *H01L 29/42376* (2013.01); *H01L 29/4966* (2013.01); *H01L 29/517* (2013.01); *H01L 29/6653* (2013.01); *H01L 29/66545* (2013.01)

(58) Field of Classification Search
  CPC ..... H01L 21/823828; H01L 21/823842; H01L 21/82385; H01L 29/42376; H01L 29/66545; H01L 29/66553
  See application file for complete search history.

(56) References Cited

U.S. PATENT DOCUMENTS

| | | | |
|---|---|---|---|
| 8,980,753 B2 * | 3/2015 | Wang | H01L 21/823842 216/47 |
| 9,178,036 B1 | 11/2015 | Xie et al. | |
| 2012/0139042 A1 | 6/2012 | Fu et al. | |
| 2014/0231885 A1 | 8/2014 | Xie et al. | |

* cited by examiner

GATE STRUCTURES AND FABRICATION METHODS THEREOF

CROSS-REFERENCES TO RELATED APPLICATIONS

This application claims the priority of Chinese Patent Application No. CN201610662540.5, filed on Aug. 12, 2016, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With continuous development of fabrication technology of integrated circuits (ICs), the requirements on the integration degree and the performance of ICs become higher and higher. In order to improve the integration degree, the critical dimensions of semiconductor devices continuously decrease and the distances between neighboring devices also become smaller and smaller, increasing technological requirements on IC fabrication.

In order to reduce the parasitic capacitance of gate electrodes and improve operation speed of semiconductor devices, a high-k metal gate (HKMG) structure, including a high-k gate dielectric layer and a metal gate electrode, has been adapted in semiconductor devices. To further reduce negative influence of the material used for the metal gate electrode on other structures in the semiconductor device, the bi-layer structure of HKMG, including a metal gate electrode and a high-k gate dielectric layer, is usually fabricated by a gate last process.

For example, forming a HKMG structure through a gate last process may include the following steps. First, a substrate may be provided. The substrate may include a dielectric layer formed on the substrate and a plurality of dummy gate structures formed in the dielectric layer. Then, a plurality of openings may be formed on the substrate by removing the plurality of dummy gate structures. The bottom of each opening may expose a portion of the surface of the substrate. Further, a gate dielectric layer may be formed on the exposed surface of the substrate in each opening and a metal gate electrode may then be formed on the gate dielectric layer. Specifically, the gate dielectric layer may be made of a material including a high-k dielectric material.

As the dimension of a device becomes smaller, the size of the gate electrode in the semiconductor structure may also decrease. Therefore, during the fabrication process, filling a conductive material into an opening with a decreased lateral dimension becomes more difficult, and thus the quality of the formed gate structure may be affected and the performance of the formed semiconductor structure may be degraded. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method for fabricating the semiconductor structure includes providing a substrate and forming a plurality of dummy gate structures. Each dummy gate structure includes a gate dielectric layer, a dummy gate electrode, and two sidewall spacers formed on sidewalls of the gate dielectric layer and the dummy gate electrode. The method for fabricating the semiconductor structure also includes forming a dielectric layer on a portion of the substrate between neighboring dummy gate structures and removing a portion of each dummy gate electrode to form a first opening in the dielectric layer. The first opening is surrounded by a remaining portion of the dummy gate electrode and the two sidewall spacers. The method for fabricating the semiconductor structure further includes removing a portion of each sidewall spacer along a direction perpendicular to the corresponding sidewall of the first opening to form a second opening, removing a remaining portion of the gate electrode on the bottom of each second opening to expose the gate dielectric layer and form a third opening, and filling each third opening with a gate electrode material to form a gate electrode.

Another aspect of the present disclosure provides a semiconductor structure. The semiconductor structure includes a substrate, a dielectric layer formed on the substrate, and a plurality of gate structures formed in the dielectric layer. Each gate structure includes a gate dielectric layer formed on the substrate, a gate electrode formed on the gate dielectric layer, and two sidewall spacers formed on sidewalls of the gate dielectric layer and the gate electrode. Moreover, along a direction parallel to the surface of the substrate, the dimension of each gate electrode at an end away from the substrate is larger than the dimension of the gate electrode at an end close to the substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
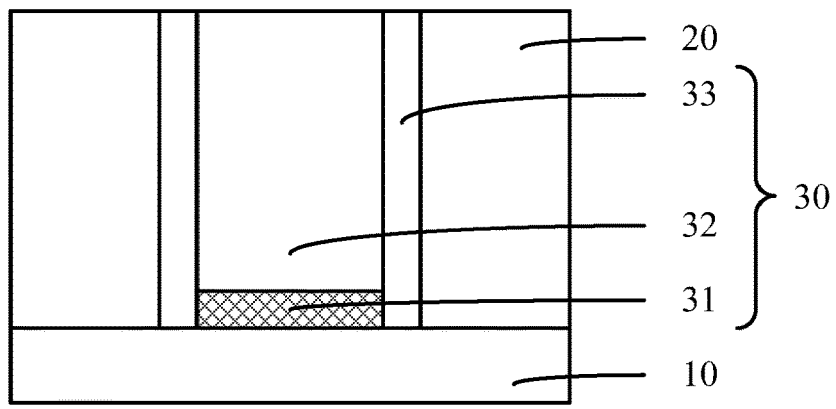
FIGS. 1-3 illustrate schematic cross-section views of semiconductor structures at certain stages of a fabrication method.
Figure 2:
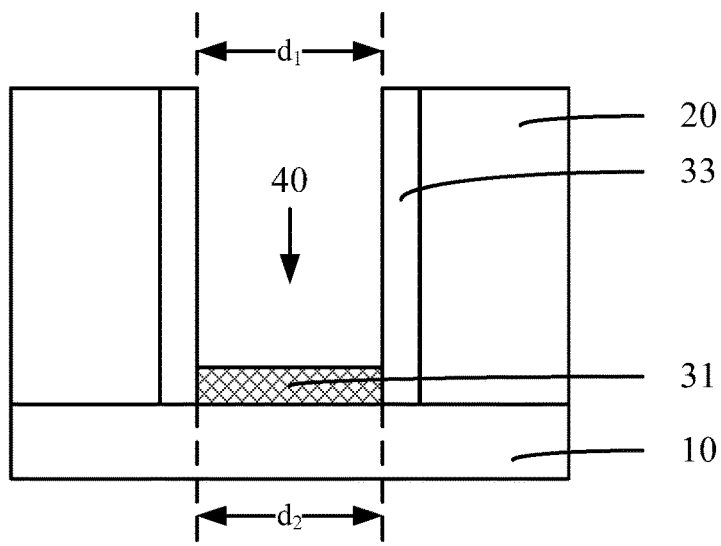
Figure 3:
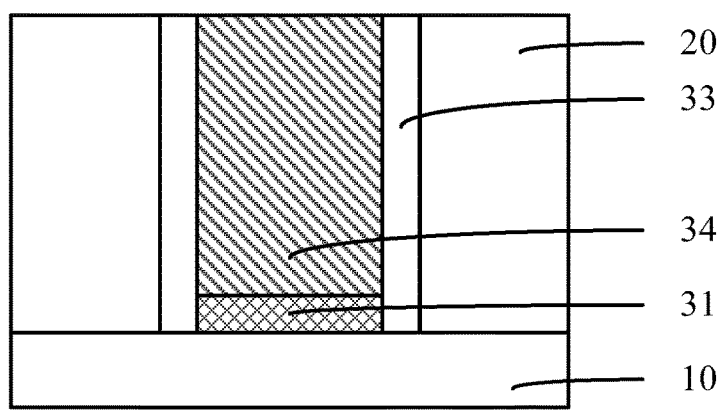

FIGS. 1-3 show schematic cross-section views of semiconductor structures at certain stages of a gate-structure fabrication method.

Referring to FIG. 1, a substrate 10 is provided. A dielectric layer 20 is formed on the substrate 10 and a dummy gate structure 30 is formed in the dielectric layer 20. Further, the dummy gate structure 30 includes a gate dielectric layer 31 formed on the substrate 10, a dummy gate electrode 32 formed on the gate dielectric layer 31, and two sidewall spacers 33 formed on the two sidewall surfaces of the gate dielectric layer 31 and the dummy gate electrode 32.

Referring to FIG. 2, the dummy gate electrode 32 (referring to FIG. 1) is then removed to form an opening 40. Further, referring to FIG. 3, a gate electrode 34 is formed by filling the opening 40 with a conductive material.

According to the fabrication method described above, the sidewall surfaces of the opening 40 are perpendicular to the surface of the substrate. That is, the top dimension $d_1$ (referring to FIG. 2) of the opening 40 at the end away from the substrate 10 is equal to the bottom dimension $d_2$ (referring to FIG. 2) of the opening 40 at the end close to the substrate 10. Therefore, as the dimension of the semiconductor structure decreases, the aspect ratio of the opening 40 becomes larger, and thus the process to fill the conductive material into the opening 40 becomes more difficult. As a result, the quality of the subsequently-formed gate electrode 34 is affected, which may further lead to degraded performance for the subsequently-formed semiconductor structure.

Figure 12:
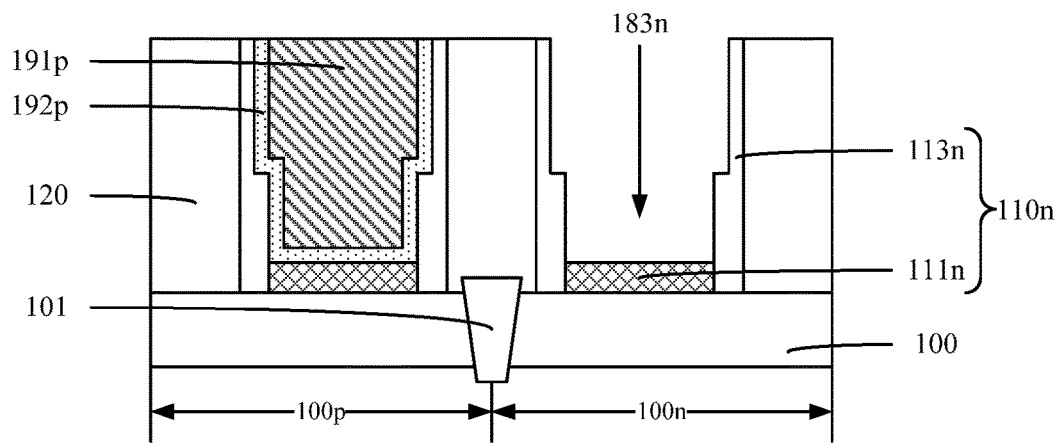
Figure 13:
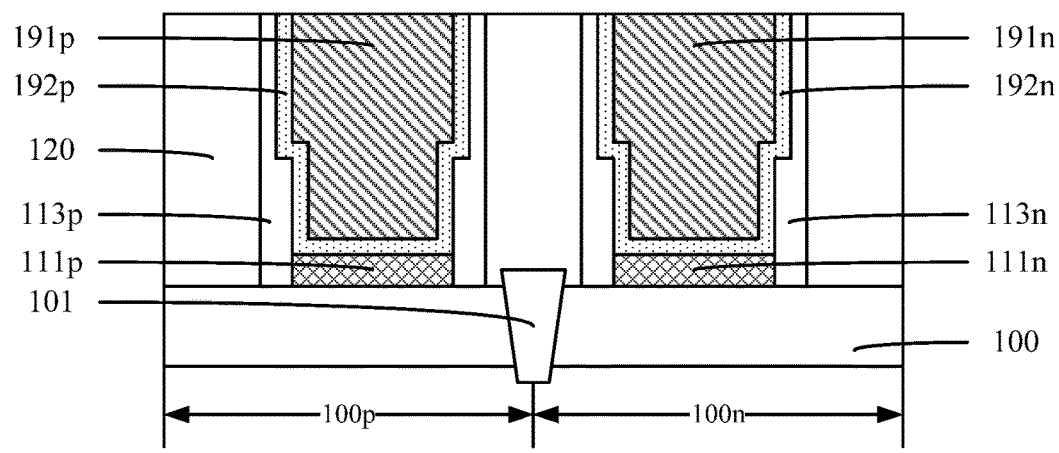
Figure 14:
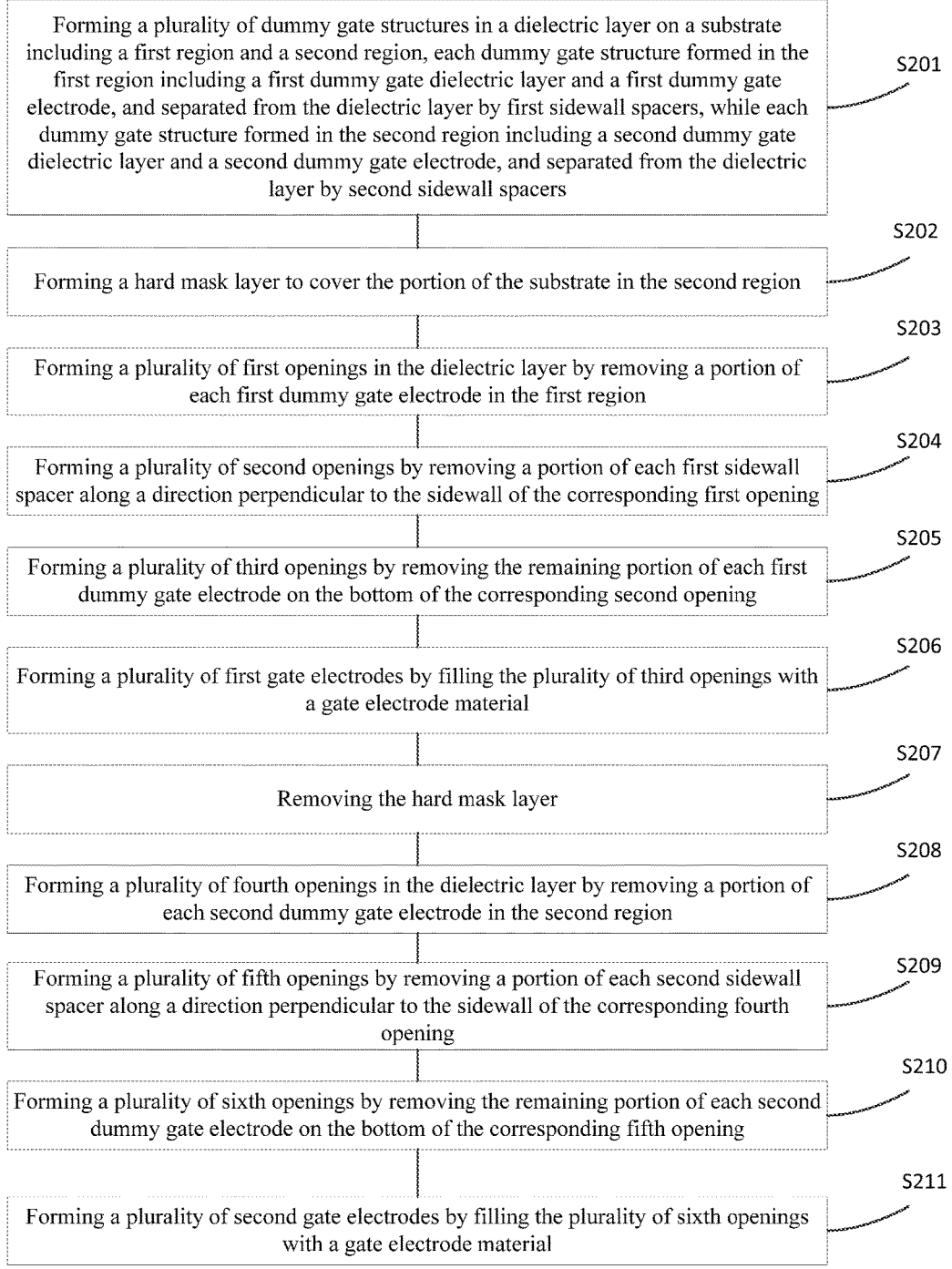
FIG. 14 illustrates a flowchart of an exemplary fabrication process for a semiconductor structure consistent with various disclosed embodiments in the present disclosure.

In view of the problems described above, the present disclosure provides a method for fabricating semiconductor structures. FIG. 14 shows a flowchart of an exemplary fabrication process for a semiconductor structure consistent with various disclosed embodiments of the present disclosure. FIGS. 4-13 show schematic cross-section views of semiconductor structures at certain stages of the exemplary fabrication process.

Figure 4:
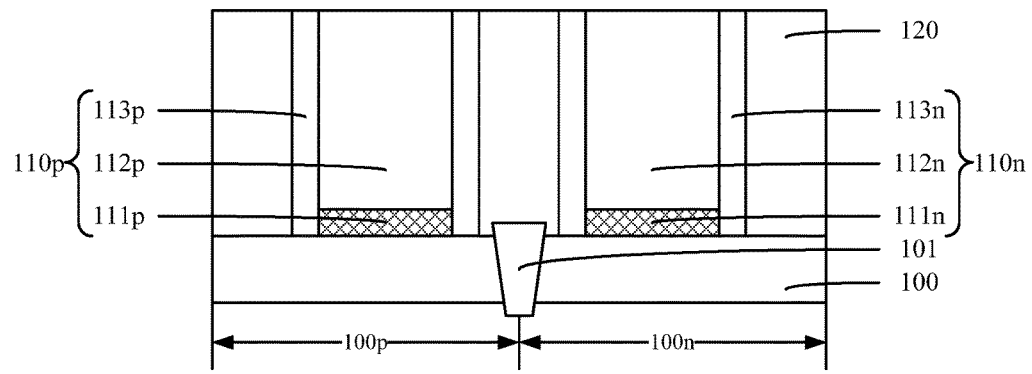
FIGS. 4-13, 15 illustrate schematic cross-section views of semiconductor structures at certain stages of an exemplary fabrication process consistent with various disclosed embodiments in the present disclosure.

Referring to FIG. 14, a substrate may be provided (S201). FIG. 4 shows a schematic cross-section view of a corresponding semiconductor structure.

Referring to FIG. 4, at the beginning of the fabrication process, a substrate 100 may be provided. The substrate 100 may provide an operation platform for the fabrication process. In one embodiment, the substrate 100 is made of single crystalline silicon. In other embodiments, the substrate may be made of polycrystalline silicon or amorphous silicon. Moreover, the substrate may also be made of germanium, GaAs, SiGe, or any other appropriate semiconductor material. Alternatively, the substrate may be a structure with an epitaxial layer or a structure with silicon formed on an epitaxial layer.

In one embodiment, the substrate 100 may include a first region 100p used to form a plurality of first type transistors and a second region 100n used to form a plurality of second type transistors. The first type transistors may be P-type metal-oxide-semiconductor (PMOS) transistors and the second type transistors may be N-type metal-oxide-semiconductor (NMOS) transistors.

Further, an isolation structure 101 may also be formed in the substrate 100. The isolation structure 101 may be formed between the first region 100p and the second region 100n. The isolation structure 101 may be used to electrically isolate the first region 100p from the second region 100n. Moreover, the isolation structure 101 may also be formed between neighboring transistors in the first region 100p or in the second region 100n to electrically isolate neighboring transistors.

The isolation structure 101 may be made of an oxide. The fabrication process for the isolation structure 101 may include the following steps. First, a first patterned layer may be formed on the surface of the substrate 100. Then, an isolation opening may be formed in the substrate 100 by etching the substrate 100 using the first patterned layer as an etch mask. Further, the isolation structure 101 may be formed by filling the isolation opening with an oxide material.

The first patterned layer may be used to define the dimension and the position of the isolation structure 101. In one embodiment, the first patterned layer is a patterned photoresist layer. The patterned photoresist layer may be formed through a coating process followed by a photolithography process. In other embodiments, the first patterned layer may also be formed by a multiple mask patterning process, such as self-aligned double patterned (SaDP) process, self-aligned triple patterned (SaTP) process, and self-aligned double double patterned (SaDDP), etc. Moreover, the process to form isolation opening may include dry etching.

Moreover, a plurality of dummy gate structures may be formed on the substrate 100. Each dummy gate structure may include a gate dielectric layer formed on the substrate 100, a dummy gate electrode formed on the gate dielectric layer, and two sidewall spacers formed on the two sidewall surfaces of the gate dielectric layer and the dummy gate electrode. Each dummy gate structure may be used to define the size and the position of a subsequently-formed gate structure.

In one embodiment, the process to form the dummy gate structure may include following steps. First, a gate dielectric material layer may be formed on the substrate 100 and a dummy gate electrode material layer may be formed on the gate dielectric material layer. Further, a second patterned layer may be formed on the dummy gate electrode material layer. Then, the gate dielectric layer and the dummy gate electrode may be formed by etching the dummy gate material layer and the gate dielectric material layer using the second patterned layer as an etch mask. Moreover, a sidewall spacing material layer may be formed on the surface of the substrate 100, the sidewall surfaces of the gate dielectric layer, as well as the top and the sidewall surfaces of the dummy gate electrode. Finally, by removing the portion of the sidewall spacing material layer formed on the surface of the substrate 100 and on the top surfaces of the dummy gate electrodes, the sidewall spacers may be formed on the sidewall surfaces of the gate dielectric layer and the dummy gate structures.

The gate dielectric material layer may be used to form the gate dielectric layer. The gate dielectric layer may be used to isolate the subsequently-formed gate electrode layer from the substrate 100. In one embodiment, the semiconductor structure may include HKMG structures. The HKMG structures may be formed by a high-k dielectric material (e.g., having a dielectric constant greater than 3.9) including $HfO_x$, $ZrO_x$, $HfSiO_x$, $La_2O_3$, $ZrSiO_x$, $TiO_x$, $TaO_x$, $(Ba,Sr)TiO_3$, $BaTiO_3$, $SrTiO_3$, $AlO_x$, etc.

The dummy gate electrode material layer may be used to subsequently form the dummy gate structures. The dummy gate structures may define the dimensions and the positions of the subsequently formed gate electrodes. In one embodiment, the dummy gate electrodes may be made of a material including polycrystalline silicon.

In one embodiment, the gate dielectric material layer and the dummy gate electrode material layer may be formed on the substrate 100 through a chemical vapor deposition (CVD) process, a physical vapor deposition (PVD) process, an atomic layer deposition (ALD) process, or any other film deposition process.

The sidewall spacing material layer may be used to form sidewall spacers in a subsequent process. The sidewall spacers may be used to provide protection for the gate dielectric layer and the dummy gate electrodes during subsequent fabrication processes. In addition, the sidewall spacers may also be used to define the shapes of the subsequently-formed gate electrodes. The sidewall spacers may be made of a material including $SiN_x$.

The dimension of each sidewall spacer along a direction perpendicular to the sidewalls of the corresponding gate dielectric layer and the corresponding dummy gate electrode may not be too small, otherwise the sidewall spacer may not be able to provide sufficient protection for the gate dielectric layer and the dummy gate electrode. The dimension of the sidewall spacer along the direction perpendicular to the sidewalls of the gate dielectric layer and the dummy gate electrode may not be too large either, otherwise the overly large dimension of the sidewall spacer may result in material waste and also lead to increased process difficulty. In one embodiment, the dimension of the sidewall spacers along the direction perpendicular to the sidewalls of the gate dielectric layer and the dummy gate electrode is in a range of approximately 5 nm to 20 nm.

Moreover, in one embodiment, the substrate 100 may include the first region 100p and the second region 100n. Accordingly, the process to form the dummy gate structures may include forming a plurality of first dummy gate structures 110p on the substrate 100 in the first region 100p and forming a plurality of second dummy gate structures 110n on the substrate 100 in the second region 100n. Each first dummy gate structure 110p may include a first gate dielectric layer 111p formed on the substrate 100 of the first region 100p, a first dummy gate electrode 112p formed on the first gate dielectric layer 111p, and two first sidewall spacers 113p formed on the sidewall surfaces of the first gate dielectric layer 111p and the first dummy gate electrode 112p. Each second dummy gate structure 110n may include a second gate dielectric layer 111n formed on the substrate 100 of the second region 100n, a second dummy gate electrode 112n formed on the second gate dielectric layer 111n, and two second sidewall spacers 113n formed on the sidewall surfaces of the second gate dielectric layer 111n and the second dummy gate electrode 112n. For illustration purposes, the semiconductor structure shown in FIG. 4 is described to have one first dummy gate structure formed in the first region 100p and one second dummy gate structure formed in the second region 100n, although the number of the first dummy gate structures in the first region 100p and/or the number of the second dummy gate structures in the second region 100n may be more than one.

Further, a dielectric layer 120 may be formed on the substrate 100 between neighboring dummy gate structures. The dielectric layer 120 may be used to electrically isolate neighboring devices. In addition, the dielectric layer 120 may also be used to define the shapes and the dimensions of subsequently-formed gate electrodes. In one embodiment, the dielectric layer 120 may be made of an oxide. In other embodiments, the dielectric layer may also be made of one or more of $SiN_x$, SiON, a low-k dielectric material (e.g., having a dielectric constant greater than or equal to 2.5 but smaller than 3.9), and an ultra-low-k dielectric material (e.g., having a dielectric constant smaller than 2.5).

The dielectric layer 120 may be formed by a process including the following steps. First, a dielectric material layer may be formed on the substrate 100 to cover the dummy gate structures. Then, a planarization process may be performed on the dielectric material layer until the top surfaces of the dummy gate electrodes are exposed. As such, the dielectric layer 120 with a top surface leveled with the top surfaces of the dummy gate structures may be formed.

The dielectric material layer may be formed on the substrate 100 through a CVD, PVD, or ALD process. The planarization process may be a chemical mechanical polishing process.

Figure 5:
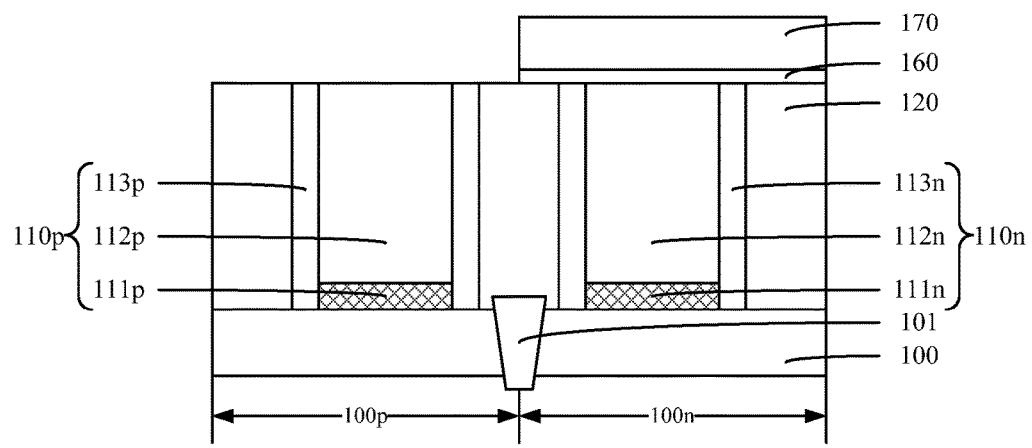

Returning to FIG. 14, further, a hard mask layer may be formed to cover the portion of the substrate in the second region (S202). FIG. 5 shows a schematic cross-section view of a corresponding semiconductor structure.

Referring to FIG. 5, in one embodiment, the substrate 100 may include both the first region 100p and the second region 100n. Because the type of transistors formed in the first region 100p may be different from the type of transistors formed in the second region 100n, the transistors may be fabricated separately for the two regions. For example, after the formation of the dielectric layer 120, a hard mask layer 160 may be formed on the substrate 100 of the second region 100n. During a subsequent process to remove a portion of the first dummy gate electrode 112p formed in the first region 100p, the hard mask layer 160 may provide protection for the second dummy gate structures 110n and the portion of the dielectric layer 120 formed on the substrate 100 of the second region 100n. Further, the hard mask layer 160 may be made of a material including $TiN_x$. Moreover, because of the absence of carbon-containing polymer in the hard mask layer 160, using the hard mask layer 160 to protect the second dummy gate structures 110n may reduce the amount of by-products produced in the subsequent process, and thus may help removing the dummy gate electrodes in the removal process and may also be conducive to reducing the amount of residue after the removal process.

The hard mask layer 160 may be formed by a process including the following steps. First, a hard mask material layer may be formed to cover the dummy gate structures and the dielectric layer 120. Further, a third patterned layer 170 may be formed on the hard mask material layer. The hard mask layer 160 may then be formed by etching the hard mask material layer using the third patterned layer 170 as an etch mask.

The third patterned layer 170 may be used to define the dimension and the position of the hard mask layer 160. In one embodiment, the third patterned layer 170 may be a patterned photoresist layer. The patterned photoresist layer may be formed through a coating process followed by a photolithography process. Moreover, in other embodiments, the third patterned layer may also be a patterned layer formed by a multiple-patterned mask process.

Figure 6:
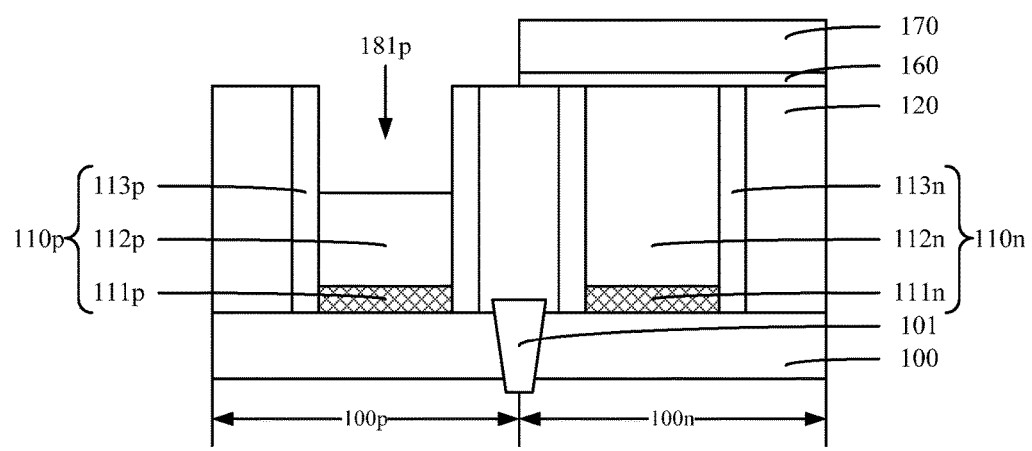

Further, returning to FIG. 14, a plurality of first openings may be formed in the dielectric layer by removing a portion of each dummy gate electrode formed in the first region (S203). FIG. 6 shows a schematic cross-section view of a corresponding semiconductor structure.

Referring to FIG. 6, after forming the hard mask layer 160, a portion of each first dummy gate electrode 112p in the first region 100p may be removed by an etching process using the hard mask layer 160 as an etch mask. As such, corresponding to the plurality of first dummy gate structures in the first region 100p, a plurality of first openings 181p may be formed in the dielectric layer. Each first opening 181p may be surrounded by a remaining portion of the first dummy gate electrode 112p and the corresponding first sidewall spacers 113p.

Each first opening 181p may be used to expose the first sidewall spacers 113p and thus provide a process surface for subsequent formation of a second opening. In one embodiment, the first opening 181p may be formed by a tetramethylammonium hydroxide (TMAH) wet etching method.

Moreover, the thickness of the remaining portion of each dummy gate electrode may not be too small or too large. When the thickness of the remaining portion of the dummy gate electrode is too small, the depth of the formed first opening may be too large, and thus the goal to reduce the process difficulty in subsequently filling conductive material may not be achieved. However, when the thickness of the remaining portion of the dummy gate electrode is too large, the thickness of a third opening formed through the remaining portion of the dummy gate electrode may be too large, and thus the goal to reduce the process difficulty in subsequently filling conductive material may not be achieved either. In one embodiment, to form the first openings 181$p$, the thickness of the remaining portion of each dummy gate electrode may be in a range of approximately 100 Å to 200 Å after the top portion of the dummy gate electrode is removed.

Figure 7:
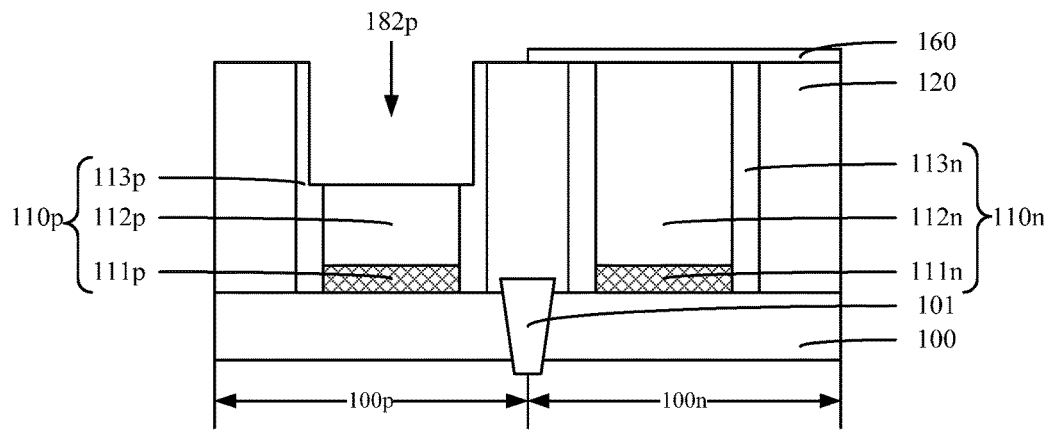

Further, returning to FIG. 14, a plurality of second openings may be formed by removing a portion of each first sidewall spacer along a direction perpendicular to the sidewall of the corresponding first opening (S204). FIG. 7 shows a schematic cross-section view of a corresponding semiconductor structure.

Referring to FIG. 7, a portion of each first sidewall spacer 113$p$ may be removed along a direction perpendicular to the sidewall of the first opening 181$p$ (referring to FIG. 6). As such, a plurality of second openings 182$p$ may be formed.

In the previous process for forming the plurality of first openings 181$p$ (referring to FIG. 6), each first opening 181$p$ may be surrounded by the remaining portion of the first dummy gate electrode 112$p$ and the corresponding first sidewall spacers 113$p$. Therefore, during the process to form the plurality of second openings, by removing a portion of the first sidewall spacers 113$p$ along the direction perpendicular to the sidewalls of the first opening 181$p$, a second opening 182$p$ may be formed.

Further, because each second opening 182$p$ may be formed by removing a portion of the first sidewall spacers 113$p$ along the direction perpendicular to the sidewalls of the corresponding first opening 181$p$, the dimension of the second opening 182$p$ may be larger than the dimension of the first opening 181$p$ along a direction parallel to the surface of the substrate 100.

The second openings 182$p$ may be formed by using an ashing process to remove the portion of the first sidewall spacers 113$p$. In one embodiment, the ashing process performed to remove the portion of the first sidewall spacers 113$p$ and form a second opening 182$p$ may use a process gas including $N_2$, $H_2$, and $NF_3$ in order to provide protection for the semiconductor structure.

Moreover, the ashing process performed to remove the portion of the first sidewall spacers and form the second opening 182$p$ may also remove the third patterned layer 170 formed on the hard mask layer 160. In other embodiment, the plurality of second openings 182$p$ may also be formed by a plasma etching process or a wet etching process.

Because ashing is an etching process that isotropically removes material, during the removal of the portion of the first sidewall spacers 113$p$, the portion of the first dummy gate electrode 112$p$ on the bottom of the second opening 182$p$ may also be affected, leading to a reduced thickness for the remaining portion of the first dummy gate electrode. In addition, along the direction perpendicular to the surface of the substrate 100, the dimension of the first sidewall spacers 113$p$ as well as the thickness of the portion of the dielectric layer 120 close to the first dummy gate structure 110$p$ may also be reduced.

In one embodiment, in order to control the thickness of the remaining portion of the first dummy gate electrode 112$p$ and avoid completely removing the first dummy gate electrode 112$p$, the process parameters adapted in the ashing process to form the second openings 182$p$ may include a flowrate of $N_2$ in a range of 200 sccm to 5000 sccm, a flowrate of $H_2$ in a range of 200 sccm to 5000 sccm, a flowrate of $NF_3$ in a range of 5 sccm to 50 sccm, a process pressure in a range of 0.5 Torr to 5 Torr, a power in a range of 1000 W to 5000 W, and a process time in a range of 10 s to 180 s.

Further, during the process to form the second openings 182$p$, along the direction perpendicular to the sidewalls of the first dummy gate electrodes 112$p$, the thickness of the removed portion of the first sidewall spacers 113$p$ may not be too small or too large. When the thickness of the removed portion of the first sidewall spacers is too small, the dimension of the formed second opening 182 may also be too small, and thus the goal to reduce the process difficulty in subsequently filling conductive material may not be achieved. However, when the thickness of the removed portion of the first sidewall spacers 113$p$ is too large, the thickness of the remaining portion of the first sidewall spacers 113$p$ may be too small such that the sidewall spacers may not be able to provide sufficient protection. Therefore, along the direction perpendicular to the sidewalls of the first openings, the thickness of the removed portion of the first sidewall spacers 113$p$ may be in a range of approximately 1 nm to 4 nm. In one embodiment, the thickness of the removed portion of the first sidewall spacers 113$p$ along the direction perpendicular to the sidewalls of the first opening is in a range of approximately 1 nm to 4 nm.

Figure 8:
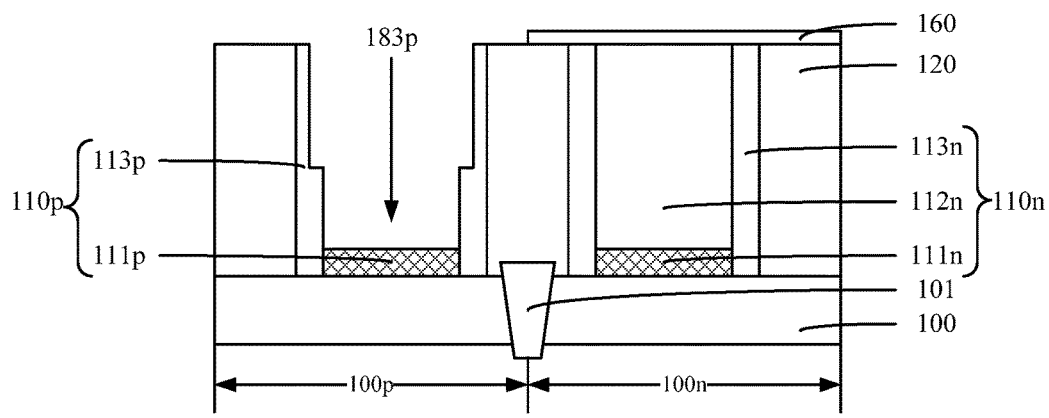

Further, returning to FIG. 14, a plurality of third openings may be formed by removing the remaining portion of each first dummy gate electrode on the bottom of the corresponding second opening (S205). FIG. 8 shows a schematic cross-section view of a corresponding semiconductor structure.

Referring to FIG. 8, the remaining portion of each first dummy gate electrode 112$p$ (referring to FIG. 7) on the bottom of each second opening 182$p$ may be removed to form a third opening 183$p$.

The third opening 183$p$ may be used to form a first gate electrode after a gate electrode material is filled into the third opening 183$p$ in a subsequent process. In one embodiment, the remaining portion of each first dummy gate electrode 112$p$ (referring to FIG. 7) on the bottom of the corresponding second opening 182$p$ (referring to FIG. 7) may be removed to form a third opening 183$p$ until the surface of the first gate dielectric layer 111$p$ is exposed. The remaining portion of the first dummy gate electrode 112$p$ on the bottom of the second opening 182$p$ may be removed by a TMAH wet etching method.

Moreover, along a direction parallel to the surface of the substrate 100, the dimension of the third opening 183$p$ at the end away from the substrate 100 may be larger than the dimension of the third opening 183$p$ at the end close to the substrate 100 because the plurality of third openings 183$p$ are formed by removing the remaining portion of the first dummy gate electrode 112$p$ (referring to FIG. 7) after forming the second openings 182$p$.

Figure 9:
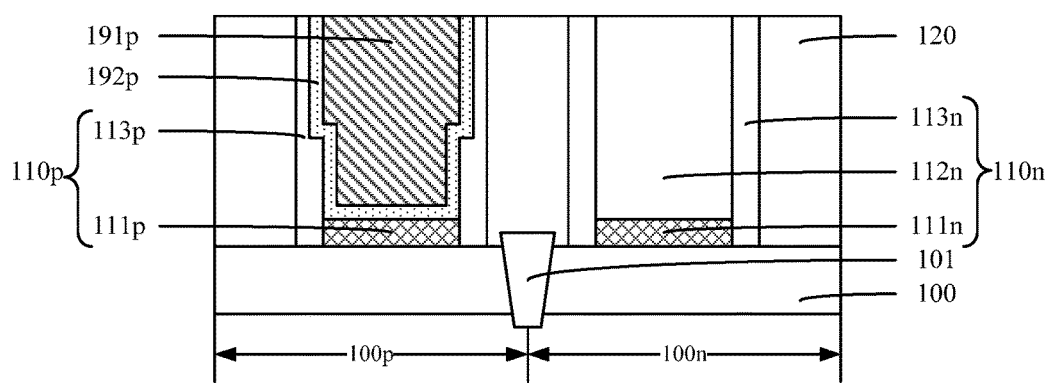

Returning to FIG. 14, further, a plurality of first gate electrodes may be formed by filling the plurality of third openings with a gate electrode material (S206). FIG. 9 shows a schematic cross-section view of a corresponding semiconductor structure.

Referring to FIG. 9, the plurality of third openings 183p (referring to FIG. 8) may be filled with a gate electrode material to form a plurality of first gate electrodes.

The first gate electrodes may be used to electrically connect to external electric circuits. Specifically, a gate electrode material may be formed into the plurality of third openings 183p to form the plurality of first gate electrodes 191p. The gate electrode material may be a conductive material. In one embodiment, the semiconductor structure may contain high-k metal gate (HKMG) structures. Therefore, the gate electrode material may be metal, including Cu, W, etc. Further, the gate electrode material may be filled into the third openings 183p through a CVD process.

Because the dimension of each third opening 183p at the end away from the substrate 100 may be larger than the dimension of the third opening 183p at the end close to the substrate 100, the aspect ratio of the third opening 183p may be small, which may help reducing the process difficulty in filling the third opening 183p with the gate electrode material, and thus may help improving the performance of the formed semiconductor structure.

In one embodiment, after forming the third openings 183p but prior to forming the first gate electrodes, the fabrication method may also include forming a first work function layer 192p on the bottom of each third opening 183p to adjust the threshold voltage of the subsequently-formed semiconductor structure. Accordingly, the process to form the plurality of first gate electrodes 191p may include forming a first gate electrode 191p on each first work function layer 192p.

For example, in one embodiment, the substrate 100 may include a first region 100p and a second region 100n. Therefore, after forming the third openings 183p in the dielectric layer 120 of the first region 100p but prior to forming the first gate electrodes 191p, the fabrication method may include forming a first work function layer 192p on the bottom of each third opening 183p. Further, because the first region 100p may be used to form PMOS transistors, the first work function layer 192p may be made of $TiN_x$. Accordingly, the process to form the plurality of first gate electrodes 191p may include forming a first gate electrode 191p on each first work function layer 192p.

Figure 15:
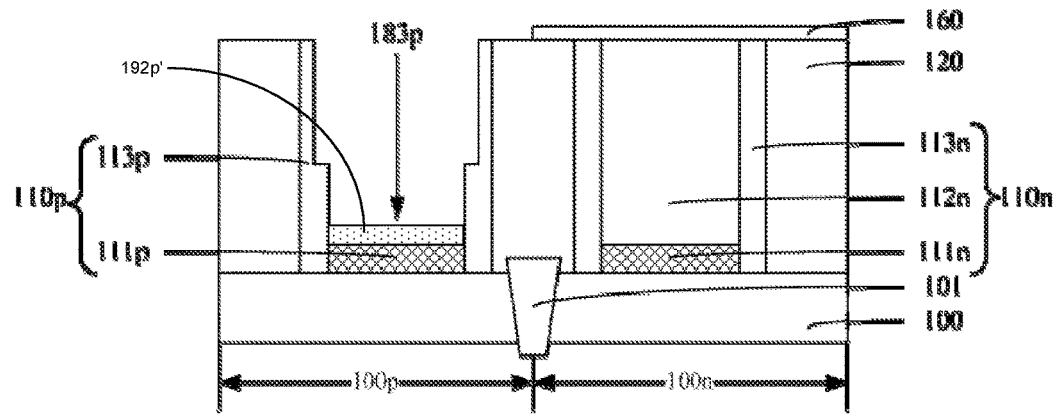

Further, the first work function layer 192p may also cover the sidewall surfaces of each third opening 183p. In other embodiment, as shown in FIG. 15, the first work function layer 192p' may cover the bottom surface of each third opening without covering the sidewall surfaces of the third opening.

Further, returning to FIG. 14, after forming the plurality of first gate electrodes, the hard mask layer may be removed to expose the plurality of second dummy gate electrodes (S207). FIG. 9 shows a schematic cross-section view of a corresponding semiconductor structure.

Referring to FIG. 9, in one embodiment, the substrate 100 may also include a second region 100n. Accordingly, the fabrication method may include removing the hard mask layer 160 (referring to FIG. 8) after forming the first gate electrodes 191p to expose the plurality of second dummy gate structures 110n.

The hard mask layer 160 may be removed by a wet etching method or a dry etching method. When the hard mask layer 160 is made of $TiN_x$, the process to remove the hard mask layer 160 may include using a dry etching method to remove the hard mask layer 160. For example, a chlorine plasma dry etching method may be used to remove the hard mask layer 160.

Figure 10:
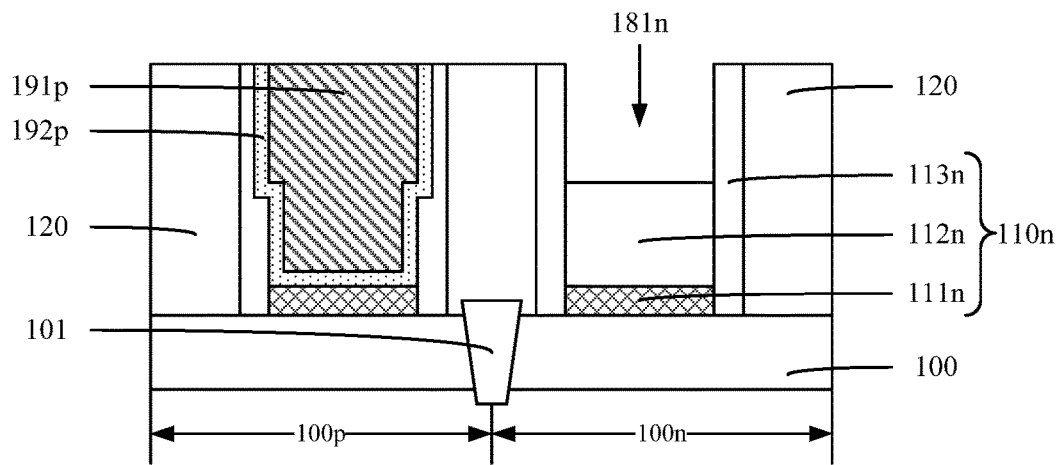

Further, returning to FIG. 14, a plurality of fourth openings may be formed in the dielectric layer by removing a portion of each second dummy gate electrode in the second region (S208). FIG. 10 shows a schematic cross-section view of a corresponding semiconductor structure.

Referring to FIG. 10, after the plurality of second dummy gate structures 110n are exposed, a portion of each second dummy gate electrode 112n may be removed to form a fourth opening 181n in the dielectric layer 120 on the substrate 100 of the second region 100n. Each fourth opening 181n may be surrounded by the remaining portion of the second dummy gate electrode 112n and the corresponding second sidewall spacers 113n.

The fourth opening 181n may be used to expose the second sidewall spacers 113n, and thus provide a process surface for subsequent fabrication processes. In one embodiment, the fourth openings 181n may be formed by a TMAH wet etching method. Moreover, after forming the fourth opening 181n, the thickness of the remaining portion of each second dummy gate electrode 112n on the bottom of a corresponding fourth opening 181n may be in a range of approximately 100 Å to 200 Å.

Figure 11:
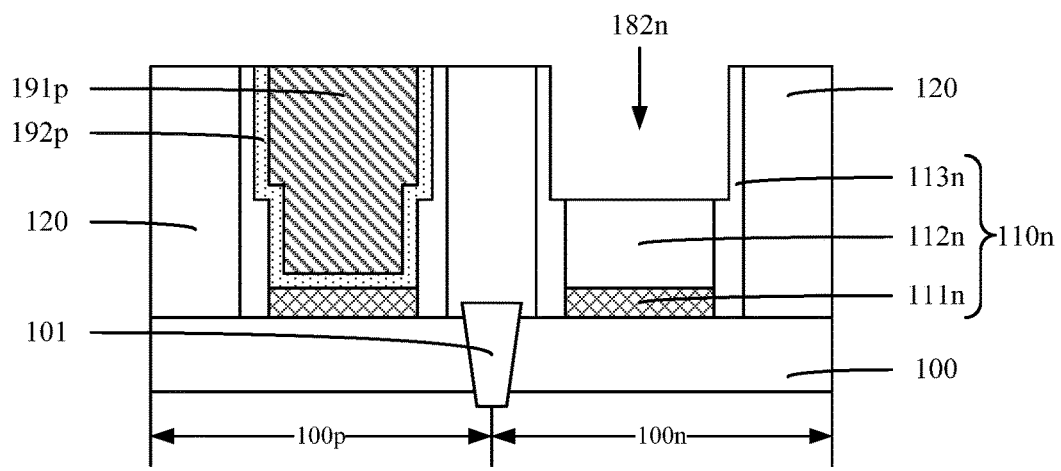

Further, returning to FIG. 14, a plurality of fifth openings may be formed by removing a portion of each second sidewall spacer along a direction perpendicular to the sidewall of the corresponding fourth opening (S209). FIG. 11 shows a schematic cross-section view of a corresponding semiconductor structure.

Referring to FIG. 11, along a direction perpendicular to the sidewalls of each fourth opening 181n (referring to FIG. 10), a portion of the second sidewall spacers 113n may be removed to form a fifth opening 182n.

In one embodiment, the process to form the fifth opening 182n may include using an ashing process to remove a portion of the second sidewall spacers 113n along the direction perpendicular to the sidewalls of the corresponding fourth opening 181n. Moreover, the ashing process may use a process gas including $N_2$, $H_2$, and $NF_3$.

In one embodiment, the process parameters adapted in the ashing process to form the fifth openings 182n may include a flowrate of $N_2$ in a range of 200 sccm to 5000 sccm, a flowrate of $H_2$ in a range of 200 sccm to 5000 sccm, a flowrate of $NF_3$ in a range of 5 sccm to 50 sccm, a process pressure in a range of 0.5 Torr to 5 Torr, a power in a range of 1000 W to 5000 W, and a process time in a range of 10 s to 180 s. In addition, the thickness of the removed portion of each second sidewall spacer 113n may be in a range of 1 nm to 4 nm.

Returning to FIG. 14, further, a plurality of sixth openings may be formed by removing the remaining portion of each second dummy gate electrode on the bottom of the corresponding fifth opening (S210). FIG. 12 shows a schematic cross-section view of a corresponding semiconductor structure.

Referring to FIG. 12, a sixth opening 183n may be formed by removing the remaining portion of the second dummy gate electrode 112n (referring to FIG. 11) on the bottom of the corresponding fifth opening 182n (referring to FIG. 11) until the surface of the second gate dielectric layer 111n is exposed.

The sixth opening 183n may be used to form a second gate electrode after a gate electrode material is filled into the sixth opening 183n. In one embodiment, because the plurality of sixth openings 183n may be formed by removing the remaining portion of the second dummy gate electrode 112n (referring to FIG. 11) after forming the fifth openings 182n, along a direction parallel to the surface of the substrate 100, the dimension of the sixth opening 183n at the end away from the substrate 100 may be larger than the dimension of the sixth opening 183n at the end close to the substrate 100. The remaining portion of the second dummy gate electrode 112n on the bottom of the fifth opening 182n may be removed by a TMAH wet etching method.

Returning to FIG. 14, further, a plurality of second gate electrodes may be formed by filling the plurality of sixth openings with a gate electrode material (S211). FIG. 13 shows a schematic cross-section view of a corresponding semiconductor structure.

Referring to FIG. 13, the plurality of sixth openings 183n (referring to FIG. 12) may be filled with a gate electrode material to form a plurality of second gate electrodes.

The second gate electrodes may be used to electrically connect to external electric circuits. Specifically, a gate electrode material may be formed into the plurality of sixth openings 183n to form the plurality of second gate electrodes 191n. The gate electrode material may be a conductive material. In one embodiment, the semiconductor structure may contain high-k metal gate (HKMG) structures. Therefore, the gate electrode material may be metal, including Cu, W, etc. Further, the gate electrode material may be filled into the sixth openings 183n through a CVD process.

Because the dimension of each sixth opening 183n at the end away from the substrate 100 may be larger than the dimension of the sixth opening 183n at the end close to the substrate 100, the aspect ratio of the sixth opening 183n may be small, which may be conducive to reducing the process difficulty in filling the sixth opening 183n with the gate electrode material, and thus may help improving the performance of the formed semiconductor structure.

In one embodiment, after forming the sixth openings 183n but prior to forming the second gate electrodes 191n, the fabrication method may also include forming a second work function layer 192n on the bottom of each sixth opening 183n to adjust the threshold voltage of the subsequently-formed semiconductor structure. Specifically, the substrate 100 may include a first region 100p and a second region 100n and the plurality of sixth openings 183n may be formed in the dielectric layer 120 of the second region 100n. Therefore, after forming the sixth openings 183n but prior to forming the second gate electrodes 191n, the fabrication method may include forming a second work function layer 192n on the bottom of each sixth opening 183n. Further, because the second region 100n may be used to form NMOS transistors, the second work function layer 192n may be made of titanium aluminide. Accordingly, the process to form the plurality of second gate electrodes 191n may include forming a second gate electrode 191n on each second work function layer 192n.

Further, the second work function layer 192n may also cover the sidewall surfaces of each sixth opening 183n. In other embodiment, the second work function layer may not cover the sidewall surfaces of each sixth opening but may only cover the bottom surface of each sixth opening.

The present disclosure also provides a semiconductor structure. FIG. 13 shows a schematic cross-section view of an exemplary semiconductor structure consistent with various embodiments of the present disclosure.

Referring to FIG. 13, the semiconductor structure may include a substrate 100, a dielectric layer 120 formed on the substrate, and a plurality of gate structures formed in the dielectric layer 120. Each gate structure may include a gate dielectric layer formed on the substrate 100, a gate electrode formed on the gate dielectric layer, and two sidewall spacers formed on the sidewall surfaces of the gate dielectric layer and the gate electrode. Further, along a direction parallel to the surface of the substrate 100, the dimension of the gate electrode at the end away from the substrate 100 may be larger than the dimension of the gate electrode at the end close to the substrate 100.

The substrate 100 may provide a process operation platform. In one embodiment, the substrate 100 is made of single crystalline silicon. In other embodiment, the substrate may be polycrystalline silicon or amorphous silicon. Moreover, the substrate may also be made of germanium, GaAs, SiGe, or any other appropriate semiconductor material. In addition, the substrate may also be a structure with an epitaxial layer or a structure with silicon formed on an epitaxial layer.

The substrate 100 may include a first region 100p used to form first type transistor(s) and a second region 100n used to form second type transistor(s). In one embodiment, the first type transistors may be PMOS transistors while the second type transistors may be NMOS transistors.

Further, an isolation structure 101 may also be formed in the substrate 100. The isolation structure 101 may be formed between the first region 100p and the second region 100n. The isolation structure 101 may be used to electrically isolate the first region 100p from the second region 100n. The isolation structure 101 may be made of an oxide.

The dielectric layer 120 may be used to electrically isolate neighboring devices; in addition, the dielectric layer 120 may also be used to define the shapes and the dimensions of subsequently-formed gate electrodes. In one embodiment, the dielectric layer 120 may be made of an oxide. In other embodiments, the dielectric layer may also be made of one or more of $SiN_x$, SiON, a low-k dielectric material (e.g., having a dielectric constant greater than or equal to 2.5 but smaller than 3.9), and an ultra-low-k dielectric material (e.g., having a dielectric constant smaller than 2.5).

The gate structure may be used to turn on or turn off the corresponding channel in the formed semiconductor structure. The gate dielectric layer may be used to electrically isolate the formed gate electrode from the substrate. The gate electrode may be used to electrically connect with external circuits. The sidewall spacers may be used to provide protection for the formed gate dielectric layer and also for the gate electrodes. In addition, the sidewall spacers may also provide the portion for the portion of the substrate 100 covered by the gate structure.

In one embodiment, the semiconductor structure may include a plurality of HKMG structures. Therefore, the gate dielectric layer may be made of a material including high-high-k dielectric material (e.g., having a dielectric constant greater than 3.9). The high-k dielectric material may include $HfO_x$, $ZrO_x$, $HfSiO_x$, $La_2O_3$, $ZrSiO_x$, $TiO_x$, $TaO_x$, $(Ba,Sr)TiO_3$, $BaTiO_3$, $SrTiO_3$, $AlO_x$, etc. The gate electrode may be made of metal, including Cu and W. The sidewall spacers may be made of $SiN_x$.

Along a direction parallel to the surface of the substrate 100, the dimension of the gate electrode at the end away from the substrate 100 may be larger than the dimension of the gate electrode at the end close to the substrate 100. Adapting such a gate electrode in the semiconductor structure may be conducive to reducing the process difficulty during the formation of the gate electrode, and thus may improve the performance of the formed semiconductor structure and also improve the product yield.

Further, along the direction parallel to the surface of the substrate 100, the difference between the dimension of the gate electrode at the end away from the substrate 100 and the dimension of the gate electrode at the end close to the substrate 100 may not be too small or too large. Specifically, when the dimension of the gate electrode at the end away from the substrate 100 only exceeds the dimension of the gate electrode at the end close to the substrate 100 by a very short amount, process difficulty may not be efficiently reduced; when the dimension of the gate electrode at the end away from the substrate 100 exceeds the dimension of the gate electrode at the end close to the substrate 100 by a very large amount, the dimension of the devices may be too large, leading to increased process difficulty. In one embodiment, along the direction parallel to the surface of the substrate 100, the difference between the dimension of the gate electrode at the end away from the substrate 100 and the dimension of the gate electrode at the end close to the substrate 100 may be in a range of about 2 nm to about 8 nm.

Moreover, in one embodiment, the semiconductor structure may also include a work function layer between the gate dielectric layer and the gate electrode of each transistor in order to adjust the threshold voltage of the transistor in the semiconductor structure.

In one embodiment, the substrate 100 may include a first region 100$p$ and a second region 100$n$. The plurality of gate structures may include first gate structures formed on the substrate 100 of the first region 100$p$ and second gate structures formed on the substrate 100 of the second region 100$n$.

Further, each first gate structure may include a first gate dielectric layer 111$p$ formed on the substrate 100 of the first region 100$p$, a first gate electrode 191$p$ formed on the first gate dielectric layer 111$p$, and two first sidewall spacers 113$p$ formed on the sidewalls of the first gate dielectric layer 111$p$ and the first gate electrode 191$p$. In addition, along a direction parallel to the substrate 100, the dimension of the first gate electrode 191$p$ at the end far away from the substrate 100 may be larger than the dimension of the first gate electrode 191$p$ at the end close to the substrate 100. Moreover, each second gate structure may include a second gate dielectric layer 111$n$ formed on the substrate 100 of the second region 100$n$, a second gate electrode 191$n$ formed on the second gate dielectric layer 111$n$, and two second sidewall spacers 113$n$ formed on the sidewalls of the second gate dielectric layer 111$n$ and the second gate electrode 191$n$. In addition, along a direction parallel to the substrate 100, the dimension of the second gate electrode 191$n$ at the end far away from the substrate 100 may be larger than the dimension of the second gate electrode 191$n$ at the end close to the substrate 100.

Accordingly, the semiconductor structure may also include a first work function layer 192$p$ in each first gate structure formed between the first gate dielectric layer 111$p$ and the first gate electrode 191$p$, and a second work function layer 192$n$ in each second gate structure formed between the second gate dielectric layer 111$n$ and the second gate electrode 191$n$. Further, the first work function layer 192$p$ may be made of TiN$_x$ while the second work function layer 192$n$ may be made of titanium aluminide.

Compared to existing fabrication methods and semiconductor structures, the disclosed fabrication methods and semiconductor structures may demonstrate several advantages.

According to the disclosed fabrication methods, after forming the plurality of first openings, a portion of the sidewall spacers may be removed along a direction perpendicular to the sidewalls of the first openings so that a plurality of second openings may be formed; then, the remaining portion of each dummy gate electrode on the bottom of a corresponding second opening may be removed to expose the corresponding gate dielectric layer and form a third opening; further, a gate electrode may be formed in each third opening. Because the second opening may be formed by removing a portion of the first sidewall spacers along the direction perpendicular to the sidewalls of the first openings while each third opening may be formed by removing a remaining portion of the first dummy gate electrode, the dimension of the formed third opening at the end away from the substrate may be larger than the dimension of the third opening at the end close to the substrate. Therefore, the aspect ratio of the third opening may be small, which may be conducive to reducing the process difficulty in filling the third opening with a gate electrode material and may also help improving the performance of the formed semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate;
   forming a plurality of dummy gate structures, each including a gate dielectric layer, a dummy gate electrode, and two sidewall spacers formed on sidewalls of the gate dielectric layer and the dummy gate electrode;
   forming a dielectric layer on a portion of the substrate between neighboring dummy gate structures;
   removing a portion of each dummy gate electrode to form a first opening in the dielectric layer, wherein the first opening is surrounded by a remaining portion of the dummy gate electrode and the two sidewall spacers;
   removing a portion of each sidewall spacer along a direction perpendicular to a corresponding sidewall of the first opening to form a second opening;
   removing a remaining portion of the gate electrode on a bottom of each second opening to expose the gate dielectric layer and form a third opening;
   forming a work function layer on a bottom of each third opening and sidewall surfaces of each third opening remain being exposed; and
   filling each third opening with a gate electrode material to form a gate electrode.

2. The method for fabricating the semiconductor structure according to claim 1, wherein a dimension of the sidewall spacer along a direction perpendicular to the sidewalls of the gate dielectric layer and the dummy gate electrode is in a range of approximately 5 nm to 20 nm.

3. The method for fabricating the semiconductor structure according to claim 1, wherein after removing the portion of each dummy gate electrode to form the first opening, a thickness of a remaining portion of each dummy gate electrode is in a range of approximately 100 Å to 200 Å.

4. The method for fabricating the semiconductor structure according to claim 1, wherein a thickness of the removed portion of each sidewall spacer along the direction perpendicular to the sidewall of the corresponding first opening during forming the second opening is in a range of approximately 1 nm to 4 nm.

5. The method for fabricating the semiconductor structure according to claim 1, wherein forming the plurality of dummy gate structures includes:
  forming the gate dielectric layer with a material including high-k dielectric material;
  forming the dummy gate electrode with a material including polycrystalline silicon; and
  forming the sidewall spacers with a material including $SiN_x$.

6. The method for fabricating the semiconductor structure according to claim 1, wherein forming the second openings including:
  using an ashing process to remove the portion of the sidewall spacers to form the second openings.

7. The method for fabricating the semiconductor structure according to claim 1, wherein each gate electrode is formed on a corresponding work function layer.

8. The method for fabricating the semiconductor structure according to claim 1, after forming the third openings and prior to forming the gate electrodes, further including forming a work function layer on a bottom of each third opening.

9. The method for fabricating the semiconductor structure according to claim 1, wherein the substrate includes a first region for forming a plurality of first type transistors and a second region for forming a plurality of second type transistors.

10. The method for fabricating the semiconductor structure according to claim 9,
  wherein:
    forming the plurality of dummy gate structures includes forming a plurality of first dummy gate structures on the substrate in the first region and forming a plurality of second dummy gate structures on the substrate in the second region, wherein each first dummy gate structure includes a first dielectric layer formed on the substrate of the first region, a first dummy gate electrode formed on the first dielectric layer, and two first sidewall spacers on the sidewalls of the first gate dielectric layer and the first dummy gate electrode, and each second dummy gate structure includes a second dielectric layer formed on the substrate of the second region, a second dummy gate electrode formed on the second dielectric layer, and two second sidewall spacers on the sidewalls of the second gate dielectric layer and the second dummy gate electrode;
    after forming the dielectric layer and prior to forming the plurality of first openings, a hard mask layer is formed on the substrate in the second region;
    forming the plurality of first openings includes removing a portion of each first dummy gate electrode using the hard mask layer as an etch mask to form the plurality of first openings, wherein each first opening is surrounded by a remaining portion of the first dummy gate electrode and two first sidewall spacers;
    forming the plurality of second openings includes removing a portion of each second sidewall spacer along a direction perpendicular to a sidewall of a corresponding first opening to form the plurality of second openings;
    forming the plurality of third openings includes removing the remaining portion of each first dummy gate electrode on a bottom of a corresponding second opening until a corresponding first gate dielectric layer is exposed;
    forming the plurality of gate electrodes includes filling each third opening with the gate electrode material to form a plurality of first gate electrodes;
    after forming the plurality of first gate electrodes, the hard mask layer is removed to expose the plurality of second dummy gate structures;
    a portion of each second dummy gate electrode is removed to form a fourth opening in the dielectric layer on the substrate of the second region, wherein the fourth opening is surrounded by a remaining portion of the second dummy gate electrode and two second sidewall spacers;
    a plurality of fifth openings are formed by removing a portion of each second sidewall spacer along a direction perpendicular to a sidewall of a corresponding fourth opening;
    a plurality of sixth openings are formed by removing the remaining portion of each second dummy gate electrode on a bottom of a corresponding fifth opening until a corresponding second gate dielectric layer is exposed, and
    a plurality of second gate electrodes are formed by filling the plurality of sixth openings with a gate electrode material.

11. The method for fabricating the semiconductor structure according to claim 10,
  wherein the hard mask layer is made of a material including $TiN_x$.

12. The method for fabricating the semiconductor structure according to claim 10 further including:
  forming a first work function layer on a bottom of each third opening after forming the plurality of third openings and prior to forming the first gate electrodes, wherein each first gate electrode is formed on a corresponding first work function layer; and
  forming a second work function layer on a bottom of each sixth opening after forming the plurality of sixth openings and prior to forming the second gate electrodes, wherein each second gate electrode is formed on a corresponding second work function layer.

13. A method for fabricating a semiconductor structure, comprising:
  providing a substrate;
  forming a plurality of dummy gate structures, each including a gate dielectric layer, a dummy gate electrode, and two sidewall spacers formed on sidewalls of the gate dielectric layer and the dummy gate electrode;
  forming a dielectric layer on a portion of the substrate between neighboring dummy gate structures;
  removing a portion of each dummy gate electrode to form a first opening in the dielectric layer, wherein the first opening is surrounded by a remaining portion of the dummy gate electrode and the two sidewall spacers;
  removing a portion of each sidewall spacer along a direction perpendicular to a corresponding sidewall of the first opening to form a second opening by using an ashing process, wherein the ashing process performed to form the second openings uses a gas including $N_2$, $H_2$, and $NF_3$;
  removing a remaining portion of the gate electrode on a bottom of each second opening to expose the gate dielectric layer and form a third opening; and
  filling each third opening with a gate electrode material to form a gate electrode.

14. The method for fabricating the semiconductor structure according to claim 13,
  wherein process parameters used in the ashing process including:
    a flowrate of $N_2$ in a range of approximately 200 sccm to 5000 sccm;

a flowrate of $H_2$ in a range of approximately 200 sccm to 5000 sccm;

a flowrate of $NF_3$ in a range of approximately 5 sccm to 50 sccm;

a process pressure in a range of approximately 0.5 Torr to 5 Torr;

a power in a range of approximately 1000 W to 5000 W; and a process time in a range of approximately 10 s to 180 s.

15. A semiconductor structure, comprising:

a substrate;

a dielectric layer formed on the substrate; and a plurality of gate structures formed in the dielectric layer, wherein:

each gate structure includes a gate dielectric layer formed on the substrate, a work function layer formed on the gate dielectric layer, a gate electrode formed on the work function layer, and two sidewall spacers formed on sidewalls of the dielectric layer and the gate electrode, wherein the work function layer is sandwiched by the gate dielectric layer and the gate electrode; and along a direction parallel to a surface of the substrate, a dimension of each gate electrode at an end away from the substrate is larger than a dimension of the gate electrode at an end close to the substrate.

16. The semiconductor structure according to claim 15, wherein:

along the direction parallel to the surface of the substrate, the dimension of each gate electrode at the end away from the substrate exceeds the dimension of the gate electrode at the end close to the substrate by about 2 nm to about 8 nm.

17. The semiconductor structure according to claim 15, wherein:

the gate dielectric layer is made of a material including high-k dielectric material; and the sidewall spacer is made of a material including $SiN_x$.

18. The semiconductor structure according to claim 15, wherein the work function layer is formed between each gate dielectric layer and a corresponding gate electrode.

19. The semiconductor structure according to claim 15, wherein:

the substrate includes a first region containing a plurality of first type transistors and a second region containing a plurality second type transistors;

gate structures formed in the dielectric layer on the substrate of the first region are first gate structures with each including a first gate dielectric layer formed on the substrate of the first region, a first gate electrode formed on the first gate dielectric layer, and two first sidewall spacers formed on sidewall surfaces of the first gate dielectric layer and the first gate electrode, wherein along the direction parallel to the surface of the substrate, a dimension of each first gate electrode at the end away from the substrate is larger than a dimension of the first gate electrode at the end close to the substrate; and gate structures formed in the dielectric layer on the substrate of the second region are second gate structures with each including a second gate dielectric layer formed on the substrate of the second region, a second gate electrode formed on the second gate dielectric layer, and two second sidewall spacers formed on sidewall surfaces of the second gate dielectric layer and the second gate electrode, wherein along the direction parallel to the surface of the substrate, a dimension of each second gate electrode at the end away from the substrate is larger than a dimension of the second gate electrode at the end close to the substrate.

20. The semiconductor structure according to claim 19 further including:

a first work function layer formed between each first gate dielectric layer and a corresponding first gate electrode; and a second work function layer formed between each second gate dielectric layer and a corresponding second gate electrode.

* * * * *